(12) United States Patent
Mathews et al.

(10) Patent No.: US 7,691,737 B2
(45) Date of Patent: Apr. 6, 2010

(54) COPPER PROCESS METHODOLOGY

(75) Inventors: Charles Ray Mathews, Austin, TX (US); Alex Bierwag, Austin, TX (US); Stuart Litwin, Round Rock, TX (US)

(73) Assignee: Spansion LLC, Sunnyvale, CA (US)

( * ) Notice: Subject to any disclaimer, the term of this patent is extended or adjusted under 35 U.S.C. 154(b) by 401 days.

(21) Appl. No.: 11/614,770

(22) Filed: Dec. 21, 2006

(65) Prior Publication Data

US 2008/0153185 A1   Jun. 26, 2008

(51) Int. Cl.
*H01L 21/4763* (2006.01)

(52) U.S. Cl. .................. 438/622; 438/620; 438/618; 438/624

(58) Field of Classification Search ......... 438/612–624, 438/637–638, 700–751, 672–673
See application file for complete search history.

(56) References Cited

U.S. PATENT DOCUMENTS 6,472,124 B1* 10/2002 Chung ..................... 430/314

* cited by examiner

*Primary Examiner*—Dung A. Le
(74) *Attorney, Agent, or Firm*—Turocy & Watson, LLP

(57) ABSTRACT

A method of deprocessing a semiconductor structure is provided. The method involves removing one or more interlevel dielectric layers and one or more metal components from a frontside of the semiconductor structure. By removing the interlevel dielectric layer and the metal component, the exposed portion of the semiconductor structure can be subjected to an inspection for defects and/or other characteristics by using an inspection tool. The inspection can aid in defect reduction strategies, among other things, when applied to new technology ramp, monitoring of baseline wafer starts, customer returns, etc.

20 Claims, 11 Drawing Sheets

COPPER PROCESS METHODOLOGY

TECHNICAL FIELD

The subject invention generally relates to deprocessing a semiconductor structure by removing an interlevel dielectric layer and/or a metal component from the frontside of the semiconductor structure.

BACKGROUND

Semiconductors or integrated circuits (commonly called ICs, or chips) typically consist of multilevel structures. IC circuits fail due to various physical, chemical or mechanical mechanisms such as circular defects, electrical overstress, contamination, or wear out. Some failure analysis approaches and procedures require a die to be delayered down to a particular layer to locate such mechanisms. Methods of delayering a die involve mechanically abrading or polishing the die using a die holder, an abrasive, and a rotatable wheel.

Abrading and polishing the die are often problematic, time-consuming and limited in their usefulness. These problems and limitations result from instability, imprecision and lack of portability of abrading/polishing equipment. Abrading and polishing may damage underlying layers and undercut interconnect metal layers. The mechanical removal of layers can easily scratch, or embed polishing media or slurry into, underlying layers. Certain portions of the die may be abraded or polished at a faster rate, resulting in non-uniform abrading or polishing across the die. The abrading/polishing angle between the die surface and the rotatable wheel may be changed, resulting delayering only one corner of the die. While abrading and polishing the die, the die may break easily.

When more delayering is needed, the user places the die back onto the die holder for more delayering. This may introduce undesired variables in the die position, so that if the die is tilted differently or rotated from its position when previously delayered, the abrading/polishing produces undesired die surface characteristics. The lack of control results in undesired die surface characteristics, which can be detrimental to delayering analysis.

Another method for delayering the die is to use reactive ion etching. The method may produce non-planar etch results due to the in-homogeneity of the target layers. Reactive ion etching may require elevated temperatures, producing non-volatile species that can contaminate other layers.

SUMMARY

The following presents a simplified summary of the invention in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

One aspect of the subject invention provides a method of deprocessing a semiconductor structure involving removing an interlevel dielectric layer and a metal component from a frontside of the semiconductor structure. By removing the interlevel dielectric layer and the metal component, the adjacent, exposed portion of the semiconductor structure can be subjected to an inspection for defects and/or other characteristics by using an inspection tool. The inspection can aid in defect reduction strategies, among other things, when applied to new technology ramp, monitoring of baseline wafer starts, customer returns, etc.

To the accomplishment of the foregoing and related ends, the invention, then, contains the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION

Figure 1:
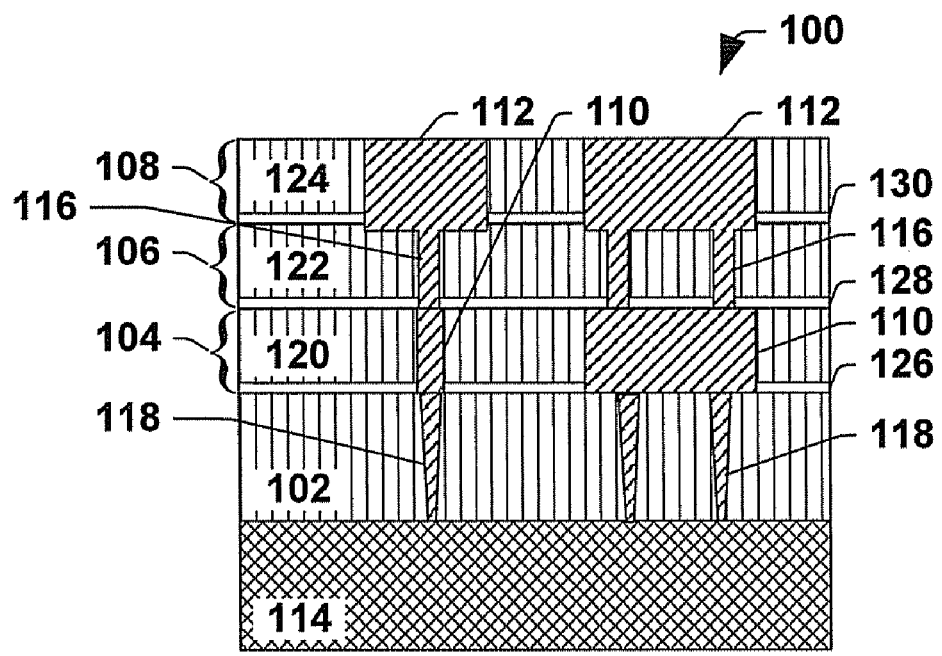
FIG. 1 illustrates a cross sectional view of a portion of an exemplary semiconductor structure being deprocessed in accordance with one aspect of the invention.

A semiconductor structure can contain multiple interconnect metal layers (Metal1, Metal2, Metal 3, etc.) stacked upon each other on a semiconductor substrate. The interconnect components can be separated from each other by interlevel dielectric layers (ILD0, ILD1, ILD2, etc.). The interconnect metal layers may be electrically coupled to each other by conductive vias or contacts which traverse the interlevel dielectric layer. The conductive vias can connect at least two conducting lines or paths in separate interconnect layers. The "metal components" in context of the subject invention can include interconnect metal layers, vias, contacts, plugs, lines, wires, paths, and the like. The "interlevel dielectric layer" or "ILD" in context of the subject invention can include an interlayer dielectric and an intermetal dielectric.

The semiconductor structure can contain one or more metal components. In one embodiment, the semiconductor structure contains about two or more interconnect metal layers. In another embodiment, the semiconductor structure contains about four or more interconnect metal layers. In yet another embodiment, the semiconductor structure contains about six or more interconnect metal layers. For example, a semiconductor structure may be a potion of a four metal layer flash memory device or a eight metal layer logic device. The meal components can contain suitable conductive materials such as, for example, aluminum (Al), Copper (Cu), an alloy of Al and Cu, and the like.

The semiconductor structure can contain one or more interlevel dielectric layers. In one embodiment, the semiconductor structure contains about three or more interlevel dielectric layers. In another embodiment, the semiconductor structure contains about five or more interlevel dielectric layers. In yet another embodiment, the semiconductor structure contains about six or more interlevel dielectric layers. The interlevel dielectric layer can contain one or more insulative layers. For example, the interlevel dielectric layer can contain one or more dielectric layers and one or more etch stop layers.

Examples of dielectric materials of the dielectric layer include dielectric material or insulating material such as silicon based dielectric materials, silicates, and low k material. Examples of silicon based dielectric materials include silicon dioxide, silicon nitride and silicon oxynitride. Examples of silicates include fluorine doped silicon glass (FSG), tetraethylorthosilicate (TEOS), borophosphotetraethylorthosilicate (BPTEOS), phosphosilicate glass (PSG), borophosphosilicate glass (BPSG), and other suitable spin-on glasses.

In a semiconductor structure, transistors may be formed on or within a semiconductor substrate and covered with an interlevel dielectric (e.g., ILD0). The gates of the transistors typically extend above the top surface of the substrate. The ILD0 may be covered by an interconnect metal layer (e.g. Metal1), which is covered by another insulative layer (e.g. ILD1) which is covered by another interconnect (e.g. Metal2).

The subject invention provides a method of deprocessing the semiconductor structure by removing an ILD and metal component from the frontside of the semiconductor structure. Specific, discrete layers can be removed without damaging or deleteriously affecting the adjacent layers that remain on the semiconductor structure. Consequently, inspection and testing of a deprocessed semiconductor structure can reveal details associated with fabrication that heretofore have been difficult or impossible to obtain. Since there are typically multiple successive layers on the semiconductor structure, deprocessing can be performed by removing layer by layer or by simultaneously removing multiple layers from the top to the bottom in order to determine where the circular defects locate. The ILD can be removed by contacting the ILD with an etchant. The metal component can be removed by contacting the metal component with an etchant or by peeling off by using a film. By deprocessing a semiconductor structure, buried layers or metal components otherwise difficult to examine can be exposed and inspected for defects.

The method can involve revealing/exposing a layer/portion of a semiconductor structure to allow analysis of the semiconductor structure. The revealed/exposed layer/portion of the semiconductor structure can be inspected for defects and/or other characteristics by using an inspection tool. The inspection can aid during the development and/or fabrication of new ICs, for controlling quality the manufacturing process, for failure analysis or for reverse engineering purposes.

The invention is now described with reference to the drawings, wherein like reference numerals are used to refer to like elements throughout. In the following description, for purposes of explanation, numerous specific details are set forth in order to provide a thorough understanding of the subject invention. It may be evident, however, that the invention can be practiced without these specific details. In other instances, well-known structures and devices are shown in block diagram form in order to facilitate describing the invention.

FIG. 1 illustrates a cross sectional view of a portion of an exemplary semiconductor structure 100 that can be subjected to the method. By way of example, the semiconductor structure contains interlevel dielectrics (e.g., ILD0 102, ILD1 104, ILD2 106, ILD3 108), and interconnect metal layers (e.g., Metal1 110, Metal2 112) on a semiconductor substrate 114. The Metal1 110 and Metal2 112 can be electrically coupled to each other by vias 116. The Metal1 110 and the semiconductor substrate 114 can be electrically coupled to each other by contacts 118. The semiconductor structure 100 can contain one or more transistors (not shown) on or within the semiconductor substrate 114.

The ILD1 104, ILD2 106, and ILD3 108 can contain dielectric layers 120, 122, 124 and etch stop layers 126, 128, 130, respectively. In one embodiment, the dielectric layers 120, 122, 124 contain a TEOS and the etch stop layers 126, 128, 130 contain a silicon nitride. Although not shown, in another embodiment, at least one of the ILD1 104, ILD2 106, and ILD3 108 contain a dielectric layer and do not contain an etch stop layer.

Figure 2:
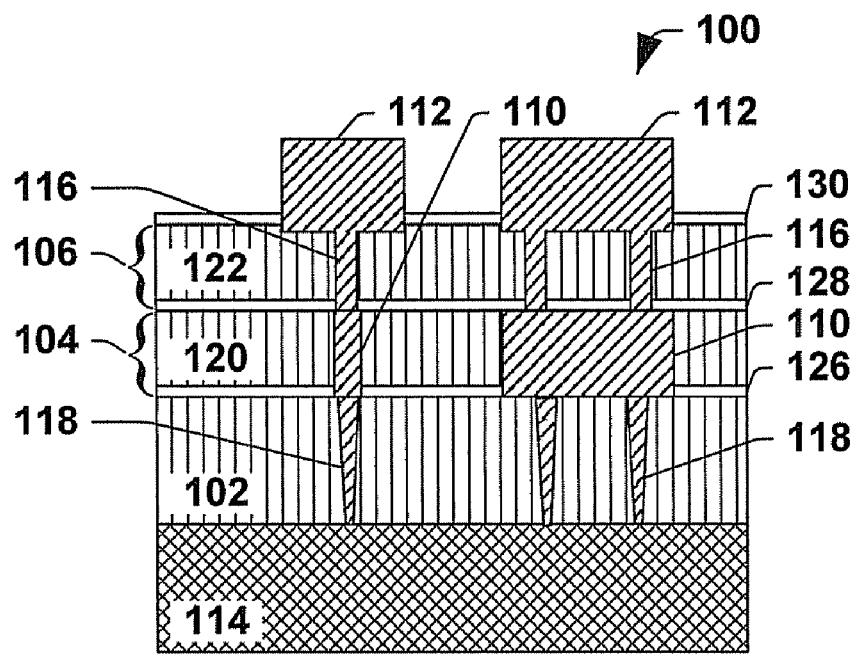
FIG. 2 illustrates a cross sectional view of an intermediate state of a portion of an exemplary semiconductor structure during deprocessing in accordance with one aspect of the invention.

FIG. 2 illustrates removing the dielectric layer 124 of the ILD3 from the exemplary semiconductor structure 100. The dielectric layer 124 can be removed by contacting the dielectric layer 124 with any suitable dielectric etchant that does not substantially affect or damage the integrity of other layers or components in the semiconductor structure 100 such as the metal components. Removing the dielectric layer 124 reveals/exposes a portion of the semiconductor structure 100 such as the Metal2 112. The revealed/exposed portion of the semiconductor structure 100 can be inspected for defects and/or other characteristics by an inspection tool. The dielectric layer 124 can be removed without masking the semiconductor structure 100. When the dielectric layer 124 is removed without masking the semiconductor structure 100, substantially all of the dielectric layer 124 can be removed.

Examples of dielectric etchants include halogen acids such as hydrofluoric acid. In one embodiment, the dielectric etchant is a hydrofluoric acid solution such as a buffered hydrofluoric acid (BHF: e.g., hydrofluoric acid-ammonium fluoride buffered solution). In another embodiment, the dielectric etchant is a vapor of hydrofluoric acid. Other dielectric etchants can also be used as long as they are capable of removing the dielectric layer 124 selective to other components of the semiconductor structure 100 such as the etch stop layer 130.

Substantially all of the dielectric layer 124 can be removed to allow inspection of a structure that is buried in or under the dielectric layer 124 such as the Metal2 112. Using the etch stop layer 130, the dielectric layer 124 can be etched with a dielectric etchant, which has a selectivity for the dielectric layer 124 to the etch stop layer 130. For example, the etching is performed on the dielectric layer 124 on the condition that the etch rate of the dielectric layer is higher than the etch rate of the etch stop layer 130, and can be terminated when the Metal2 112 is exposed for inspection.

The dielectric layer 124 is contacted with the dielectric etchant under any suitable conditions to facilitate removing the dielectric layer 124 that depend upon, for example, the constituents of the dielectric layer 124 and dielectric etchant, the thickness of the dielectric layer 124, the selectivity between the dielectric layer 124 and the etch stop layer 130, and/or the configuration of the semiconductor structure 100 being deprocessed. In one embodiment, the dielectric layer 124 is contacted with dielectric etchant under any suitable conditions so that the dielectric etchant can remove the dielectric layer 124 without substantially affecting the integrity of other components of the semiconductor structure 100. The dielectric layer 124 can be removed by contacting the dielectric layer 124 with the dielectric etchant with or without agitation of the dielectric etchant.

In one embodiment, the dielectric etchant is a BHF. By way of example, removing the dielectric layer 124 using a BHF solution is described below. Removing the dielectric layer 124 using the BHF solution is typically administered by immersing the semiconductor structure 100 into the BHF solution or spraying/spreading the BHF solution over the top of the semiconductor structure 100.

The BHF solution can contain a sufficient amount of hydrofluoric acid and ammonium fluoride to facilitate removing the dielectric layer 124 from the semiconductor structure 100. In one embodiment, the BHF solution has a ratio by weight ranging about 7:1 to about 200:1 of ammonium fluoride to hydrofluoric acid. In another embodiment, the BHF solution contains about 0.0001% of hydrofluoric acid by weight or more and about 3% of hydrofluoric acid by weight or less and about 0.0007% of ammonium fluoride by weight or more and about 25% of ammonium fluoride by weight or less. Hydrofluoric acid and ammonium fluoride may be diluted in water, such as de-ionized water, to produce the BHF solution having a desired concentration of hydrofluoric acid and ammonium fluoride.

The dielectric layer 124 is contacted with the BHF solution at a suitable temperature to facilitate removing the native oxide. In one embodiment, the dielectric layer 124 is contacted with the BHF solution at a temperature of about 5 degrees Celsius or more and about 100 degrees Celsius or less. In another embodiment, the dielectric layer 124 is contacted with the BHF solution at a temperature of about 10 degrees Celsius or more and about 90 degrees Celsius or less. The dielectric layer 124 is contacted with the BHF solution for a suitable time to facilitate removing the dielectric layer 124. In one embodiment, the dielectric layer 124 is contacted with the BHF solution for about 5 seconds or more and about 60 minutes or less. In another embodiment, the dielectric layer 124 is contacted with the BHF solution for about 10 seconds or more and about 40 minutes or less.

Figure 3:
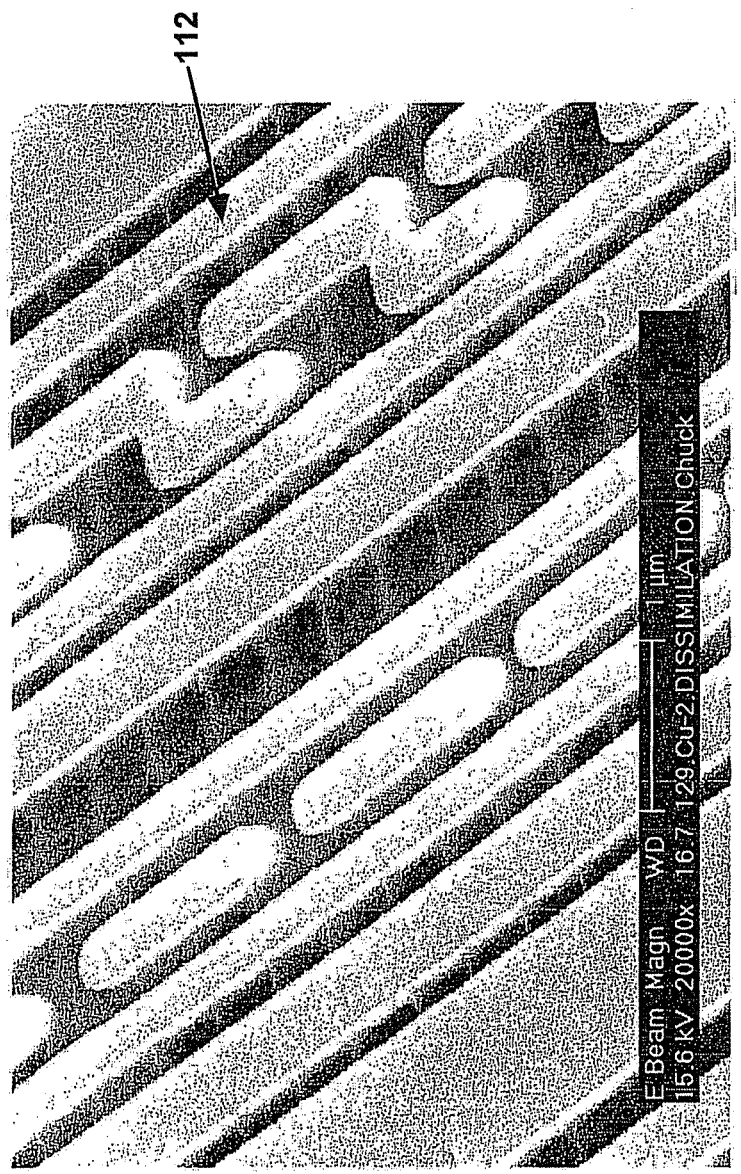
FIG. 3 shows a scanning electron microscope (SEM) picture of the surface of an exemplary semiconductor structure after removing an interlevel dielectric layer in accordance with one aspect of the invention.

FIG. 3 shows a SEM picture of the surface of an exemplary semiconductor structure after removing an ILD3 108. As shown in FIG. 3, an interconnect metal layer 112 is exposed and can be inspected by the SEM.

Figure 4:
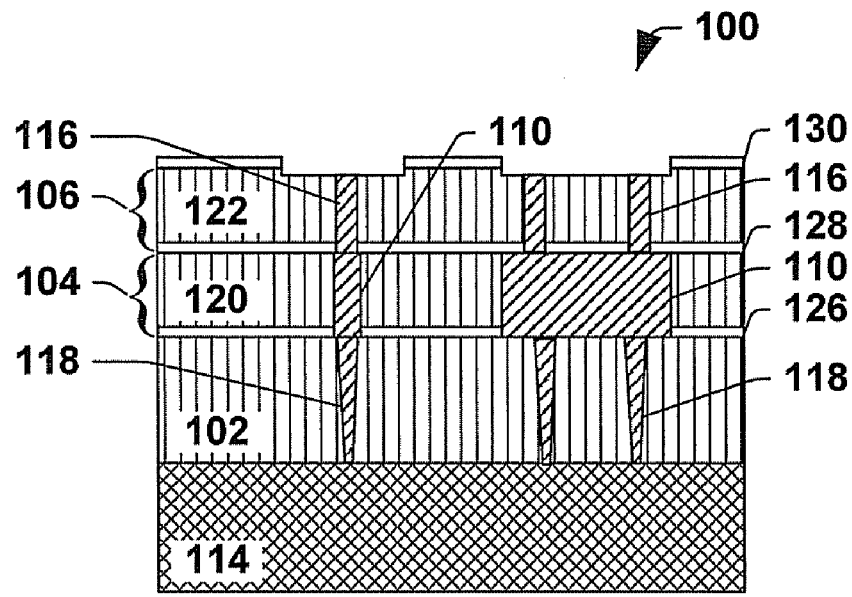
FIGS. 4-7 illustrate cross sectional views of an intermediate state of a portion of an exemplary semiconductor structure during deprocessing in accordance with one aspect of the invention.

FIG. 4 illustrates removing the Metal2 112 from the exemplary semiconductor structure 100. Removing the Metal2 112 reveals/exposes a portion of the semiconductor structure 100 such as the underlying vias 116. The revealed/exposed portion of the semiconductor structure 100 can be inspected for defects and/or other characteristics by an inspection tool. The Metal2 112 can be removed without masking the semiconductor structure 100. When the Metal2 112 is removed without masking the semiconductor structure 100, substantially all of the Metal2 112 can be removed.

The Metal2 112 can be removed by contacting the Metal2 112 with any suitable metal etchant that does not substantially affect or damage the integrity of other layers in the semiconductor structure 100 such as the vias 116 and/or the ILDs. Examples of metal etchants include an oxidizing etchant solution. Examples of oxidizing etchants include an acidic solution containing, for example, $H_2SO_4/H_2O_2$, $HCl/H_2O_2$, $H_2O_2/NH_4OH/H_2O$, $H_3PO_4$, $HNO_3$, or $CH_3COOH$. Other metal etchants can also be used as long as they are capable of removing the Metal2 112 selective to other components of the semiconductor structure 100 such as the dielectric layer of the ILD2 106, the etch stop layer of ILD2 106 and/or a barrier layer (not shown) containing, for example, tantalum.

Substantially all of the Metal2 112 can be removed to allow inspection of the structure beneath the Metal2 112 such as the underlying vias 116. The Metal2 112 is contacted with a metal etchant under any suitable conditions to facilitate removing the Metal2 112 that depend upon, for example, the constituents of the Metal2 112 and metal etchant, the thickness of the Metal2 112, and/or the configuration of the semiconductor structure 100 being deprocessed. The Metal2 112 can be removed by contacting the Metal2 112 with the metal etchant with or without agitation of the metal etchant.

By way of example, removing the Metal2 112 using $H_2SO_4/H_2O_2$ is described below. Removing the Metal2 112 using $H_2SO_4/H_2O_2$ is typically administered by immersing the semiconductor structure 100 into a $H_2SO_4/H_2O_2$ solution or spraying/spreading the $H_2SO_4/H_2O_2$ solution over the top of the semiconductor structure 100.

The $H_2SO_4/H_2O_2$ solution can contain a sufficient amount of sulfuric acid and hydrogen peroxide to facilitate removing the Metal2 112 from the semiconductor structure 100. In one embodiment, the $H_2SO_4/H_2O_2$ solution contains about 5% of sulfuric acid by weight or more and about 90% of sulfuric acid by weight or less and about 5% of hydrogen peroxide by weight or more and about 90% of hydrogen peroxide by weight or less. Sulfuric acid and hydrogen peroxide may be diluted in water, such as de-ionized water, to produce the $H_2SO_4/H_2O_2$ solution having a desired concentration of sulfuric acid and hydrogen peroxide.

The Metal2 112 is contacted with the $H_2SO_4/H_2O_2$ solution at a suitable temperature to facilitate removing the Metal2 112. In one embodiment, the Metal2 112 is contacted with the $H_2SO_4/H_2O_2$ solution at a temperature of about 5 degrees Celsius or more and about 100 degrees Celsius or less. In another embodiment, the Metal2 112 is contacted with the $H_2SO_4/H_2O_2$ solution at a temperature of about 10 degrees Celsius or more and about 90 degrees Celsius or less. The Metal2 112 is contacted with the $H_2SO_4/H_2O_2$ solution for a suitable time to facilitate removing the Metal2 112. In one embodiment, the Metal2 112 is contacted with the $H_2SO_4/H_2O_2$ solution for about 5 seconds or more and about 10 minutes or less. In one embodiment, the Metal2 112 is contacted with the $H_2SO_4/H_2O_2$ solution for about 10 seconds or more and about 8 minutes or less.

Figure 5:
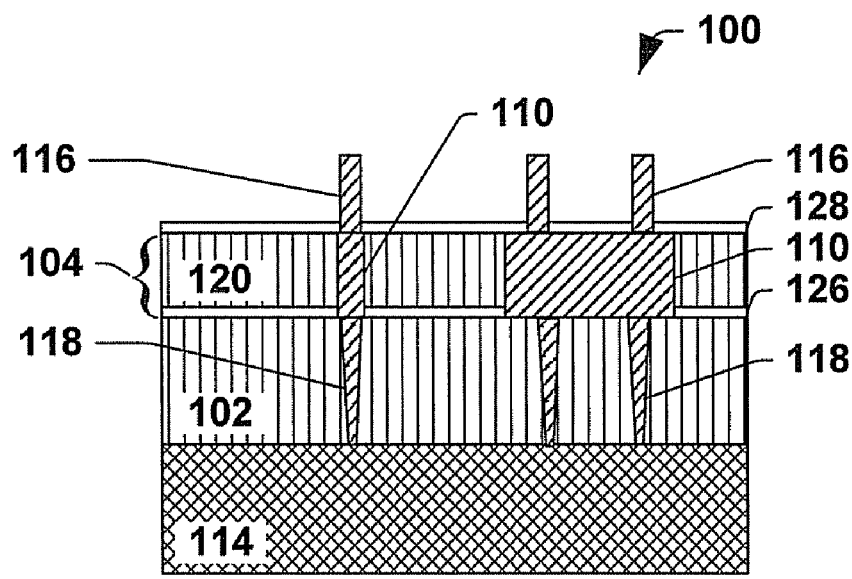

FIG. 5 illustrates removing the etch stop layer 130 of ILD3 108 and the dielectric layer 122 of ILD2 106 from the exemplary semiconductor structure 100. Removing the etch stop layer 130 of ILD3 108 and the dielectric layer 122 of ILD2 106 reveals/exposes a portion of the semiconductor structure 100 such as the vias 116. The revealed/exposed portion of the semiconductor structure 100 can be inspected for defects and/or other characteristics by an inspection tool. The etch stop layer 130 of ILD3 108 and the dielectric layer 122 of ILD2 106 can be removed without masking the semiconductor structure 100. When the etch stop layer 130 of ILD3 108 and the dielectric layer 122 of ILD2 106 is removed without masking the semiconductor structure 100, substantially all of the etch stop layer 130 of ILD3 108 and the dielectric layer 122 of ILD2 106 can be removed.

Substantially all of the etch stop layer 130 of ILD3 108 and the dielectric layer 122 of ILD2 106 can be removed to allow inspection of a structure that is buried in or under the etch stop layer 130 of ILD3 108 and the dielectric layer 122 of ILD2 106 such as the vias 116. The etch stop layer 130 can be removed by a suitable etchant that is the same as the dielectric etchant or that is different from the dielectric etchant.

While a dielectric etchant generally has a selectivity for the dielectric layer 122 to the etch stop layer 130, the etch stop layer 130 of ILD3 108 and the dielectric layer 122 of ILD2 106 can be etched at one time with the dielectric etchant by conducting etching under suitable conditions, for example, for a longer etching time sufficient for etching both the two layers than that for removing only the dielectric layer 122. Since the etching rate of the etch stop layer 130 by the dielectric etchant is slower than that of the dielectric layer 122, the etching time to etch both the etch stop layer 130 of ILD3 108 and the dielectric layer 122 of ILD2 106 is longer than the etching time to etch the dielectric layer 122.

For example, when the etch stop layer 130 of ILD3 108 contains silicon a nitride and the dielectric layer 122 of ILD2 106 contains a TEOS, a BHF can be employed to etch both the etch stop layer 130 of ILD3 108 and the dielectric layer 122 of ILD2 106 at one time. A BHF etching rate of the silicon nitride etch stop layer 130 is about one tenth of a BHF etching rate of TEOS dielectric layer 122. To remove the etch stop layer 130 of ILD3 108 by the BHF, the semiconductor structure 100 is contacted with the BHF for a longer time.

The etch stop layer 130 of ILD3 108 and the dielectric layer 122 of ILD2 106 are contacted with etchants under any suitable conditions to facilitate removing the etch stop layer 130 of ILD3 108 and the dielectric layer 122 of ILD2 106. The conditions may depend upon, for example, the constituents of the etch stop layer 130 of ILD3 108 and the dielectric layer 122 of ILD2 106, the constituents of the etchants, the thickness of the etch stop layer 130 of ILD3 108 and the dielectric layer 122 of ILD2 106, and/or the configuration of the semiconductor structure 100 being deprocessed. For example, the etch stop layer 130 of ILD3 108 and the dielectric layer 122 of ILD2 106 can be removed under the conditions as described above for etching the dielectric layer 124 of ILD3 108.

Although not shown, when an ILD of the semiconductor structure 100 contains a dielectric layer but does not contain a etch stop layer, the dielectric layer can be removed by contacting the dielectric layer with an etchant.

Figure 6:
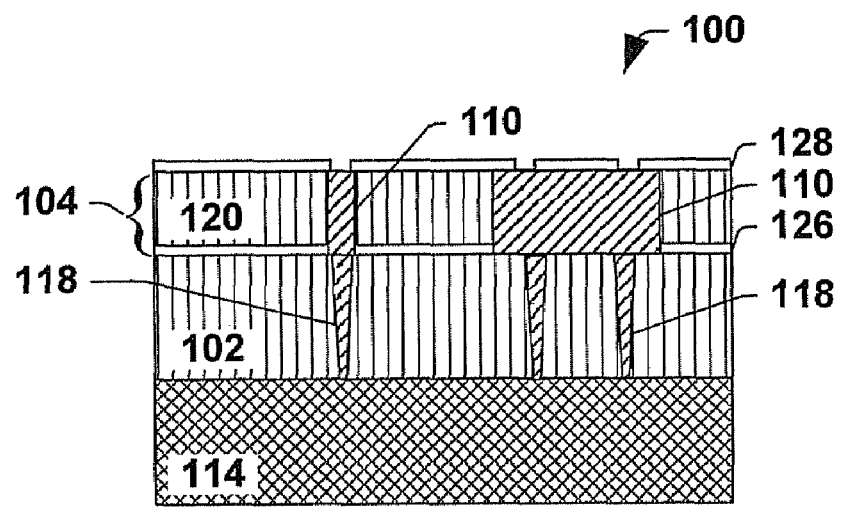

FIG. 6 illustrates removing the vias 116 from the exemplary semiconductor structure 100. Removing the vias 116 reveals/exposes a portion of the semiconductor structure 100 such as the Metal1 110. The revealed/exposed portion of the semiconductor structure 100 can be inspected for defects and/or other characteristics by an inspection tool. The vias 116 can be removed without masking the semiconductor structure 100. When the vias 116 is removed without masking the semiconductor structure 100, substantially all of the vias 116 can be removed.

The vias 116 can be removed by contacting the vias 116 with any suitable metal etchant that does not substantially affect or damage the integrity of other layers in the semiconductor structure 100 such as the ILDs. The vias 116 can be removed under the conditions as described above for removing the Metal2 112.

Figure 7:
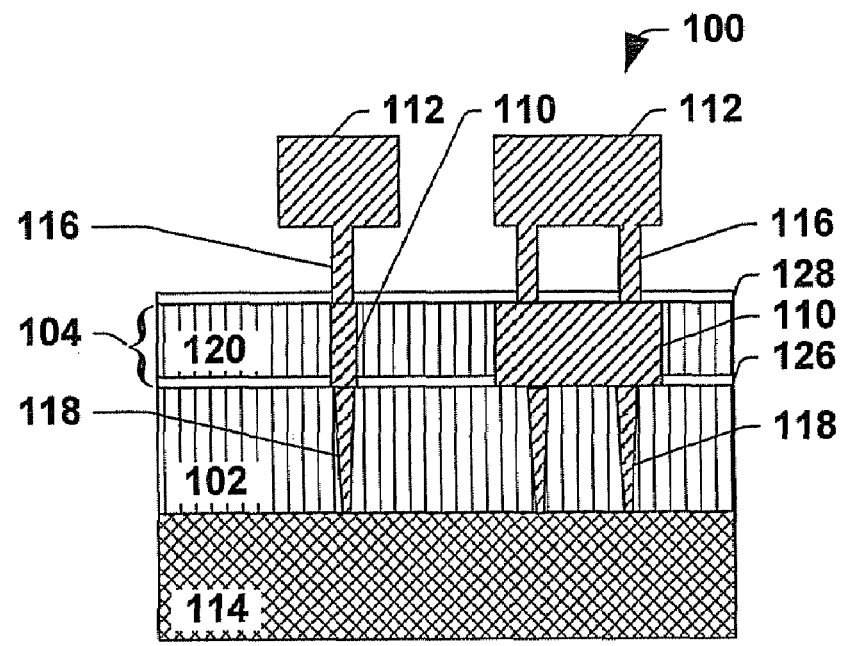

The method can involve removing one or more layers at one time from the semiconductor structure 100 at one time. FIG. 7 illustrates an exemplary method of removing multiple layers at one time from the exemplary semiconductor structure 100. For example, a desired amount of ILD2 106 and ILD3 108 can be removed at one time. By contacting the semiconductor structure 100 with a suitable etchant under suitable conditions, for example, for a longer etching time than that for removing one layer, multiple layers (e.g., the dielectric layer 124 of ILD3 108, the etch stop layer 130 of ILD3 106, and the dielectric layer 122 of ILD2 106) can be removed by etching at one time. For example, a desired amount of the dielectric layer 124 of ILD3 108, the etch stop layer 130 of ILD3 106, and the dielectric layer 122 of ILD2 106 can be removed under the conditions as described above for etching the dielectric layer 124 of ILD3 108. In this example, the etching can be terminated when the etchant etches down to the etch stop layer 128 of ILD2 106.

The etchants that can be employed in the method can be an isotropic etchant. The isotropic nature of the etch causes removal of material at substantially the same rate in both the vertical and horizontal directions, thereby etching materials under metal trenches (e.g., material under the Metal2 112 or material between the vias 116). The isotropic nature of the etch can also help to correct for any non-uniform layer thickness variation across the semiconductor substrate 114. Examples of isotropic etchants include hydrofluoric acid such as BHF.

Figure 8:
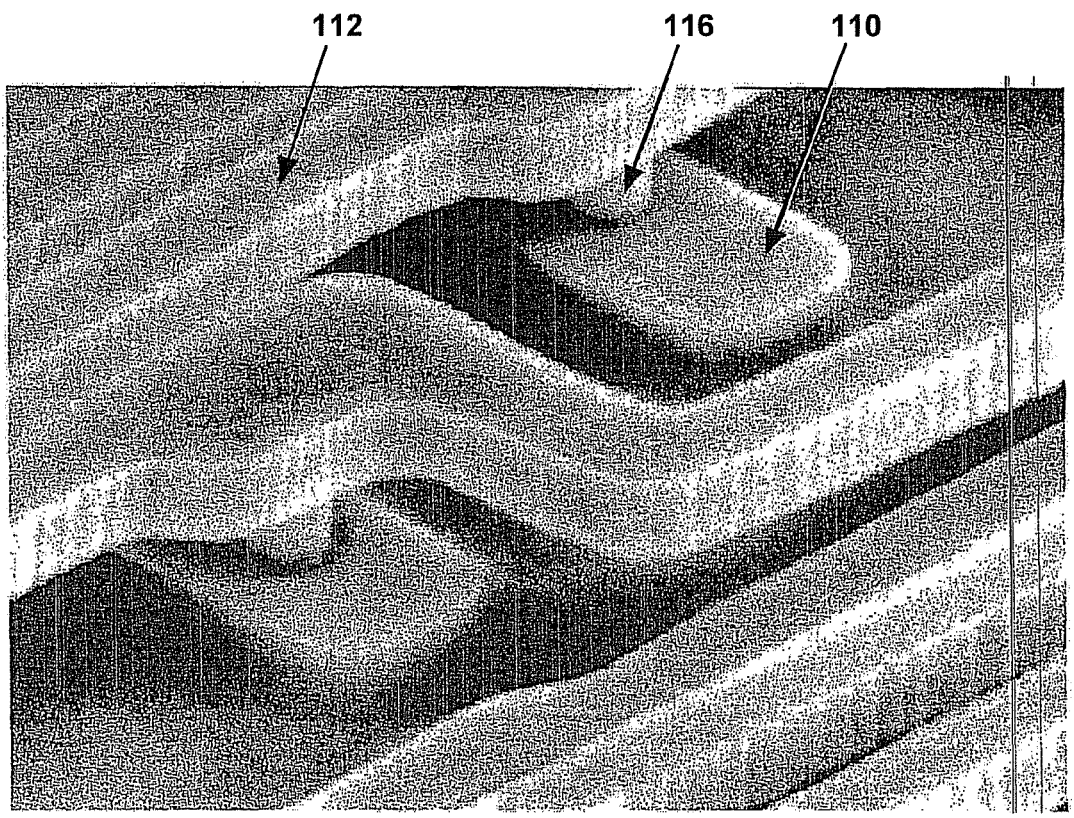
FIG. 8 shows a SEM picture of the surface of an exemplary semiconductor structure after removing interlevel dielectric layers in accordance with one aspect of the invention.

FIG. 8 shows a SEM picture of the surface of an exemplary semiconductor structure after removing ILD3 108 and ILD2 106. As shown in FIG. 8, Metal2 112, vias 116, and Metal1 110 are exposed, and can be inspected by the SEM.

Figure 9:
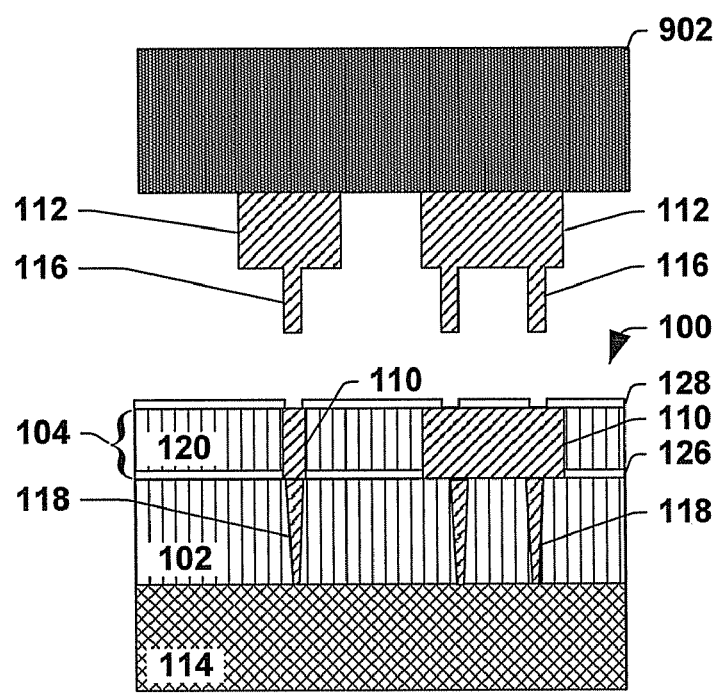
FIG. 9 illustrates a cross sectional view of an intermediate state of a portion of an exemplary semiconductor structure during deprocessing in accordance with one aspect of the invention.

The method can involve removing one or more metal components at one time from a semiconductor structure. One or more metal components can be removed by peeling off by using a film that attaches or bonds to the metal components. FIG. 9 illustrates removing two metal components (e.g., Metal2 112 and the vias 116) by using a film 902 at one time from the exemplary semiconductor structure 100. The Metal2 112 and underlying vias 116 can be removed by peeling off by using the film 902 that attaches or bonds to the metal components (e.g., Metal2 112). Removing the Metal2 112 and underlying vias 116 reveals/exposes a portion of the semiconductor structure 100 such as the etch stop layer of ILD1 104 and the dielectric layer 122 of ILD2 106. The revealed/exposed portion of the semiconductor structure 100 can be inspected for defects and/or other characteristics by an inspection tool.

Substantially all of the Metal2 112 and vias 116 can be removed to allow inspection of a structure that is beneath the Metal2 112 and vias 116. A film 902 that can attach or bond to the Metal2 112 is applied to the semiconductor structure 100 and then the film 902 is peeled off, thereby extracting the Metal2 112 and vias 116 from the semiconductor structure 100. Any suitable film 902 can be employed to remove the Metal2 112 and vias 116 as long as the film 902 can attach or bond to the Metal2 112 and peel off the Metal2 112 and vias 116 from the semiconductor structure 100.

Examples of films include cellulose acetate film (e.g., cellulose triacetate (TAC) film and cellulose diacetate film), polyester film, polyethylene terephthalate film, polyethylene naphthalate film, polyamide film, polyimide film, acrylic film, polyarylate film, polyether sulfone film, cyclic polyolefin film, and the like. Any suitable commercially available film can be employed. For example, a TAC film such as Triphan® manufactured by Lonza AG can be employed.

The film 902 has a suitable thickness to attach or bond the metal components. In one embodiment, the film 902 has a thickness of about 0.03 mm or more and about 0.5 mm or less. In another embodiment, the film 902 has a thickness of about 0.05 mm or more and about 0.3 mm or less. In yet another embodiment, the film 902 has a thickness of about 0.07 mm or more and about 0.2 mm or less.

A plasticizer, occasionally called as a softener, can be used to impart flexibility to the film 902. For example, a regenerated cellulose film 902 can be impregnated with the plasticizer by immersion of the film 902 in a plasticizer containing solution (e.g., solution containing about 5% of plasticizer by weight or more and about 15% of plasticizer by weight). Examples of plasticizers include polypropylene glycol, polyethylene glycol, glycerine, and other polyhydric alcohols and mixtures thereof.

The film 902 can be put over the semiconductor structure 100. For example, the film 902 is applied by rolling the film 902 over the semiconductor structure 100. Then, the film 902 can be attached or bonded to the Metal2 112 by any suitable methods. In one embodiment, the film 902 is attached or bonded to the Metal2 112 by dissolving the film 902 over the semiconductor structure 100 by a solvent and resolidifying the dissolved film 902.

The film 902 can be partially or substantially dissolved by the solvent on the semiconductor structure 100. In one embodiment, about 0.001 mm or more of the film 902 and about 0.1 mm or less of the film 902 can be dissolved by the solvent. In another embodiment, about 0.002 mm or more of the film 902 and about 0.05 mm or less of the film 902 can be dissolved by the solvent. In yet another embodiment, about 0.003 mm or more of the film 902 and about 0.02 mm or less of the film 902 can be dissolved by the solvent.

Any suitable solvent can be employed as long as the solvent dissolves at least a portion of or substantially all of the film 902. Examples of solvents include alkanes such as butane, pentane, hexane, heptane, octanes, decane, kerosene, cyclopentane, cyclohexane, and cyclooctane; aromatic hydrocarbons such as benzene, toluene, xylene, ethylbenzene, and naphthalenes; oxygen containing compounds such as alcohols and glycols; ketones; esters; ethers; and the like.

The dissolved film 902 may flow under metal components such as the Metal2 112 and/or flow into a space between metal components such as a space between the metal trenches (e.g., the Metal2 112) and a space between the vias 116. When the film 902 is dissolved in the solvent, then the dissolved film 902 can be resolidified by any suitable method, for example, heating and evaporating. In one embodiment, the dissolved film 902 is resolidified by evaporation the solvent for about 5 seconds or more and about 5 minutes or less. In another embodiment, the dissolved film 902 is resolidified by evaporation the solvent for about 7 seconds or more and about 4 minutes or less. In yet another embodiment, the dissolved film 902 is resolidified by evaporation the solvent for about 10 seconds or more and about 3 minutes or less.

In another embodiment, the film 902 can be attached or bonded to the Metal2 112 by an adhesive. Examples of adhesives include a rubber type adhesive comprising natural rubber, synthetic isoprene rubber, regenerated rubber, styrene/butadiene rubber, polyisoprene rubber, styrene/isoprene/styrene rubber, and the like; an acrylic adhesive; a urethane adhesive; and a silicone adhesive. In one embodiment, the adhesive is an acryl or a urethane-based pressure-sensitive adhesive.

By way of example, removing metal components by attaching/bonding a cellulose acetate film 902 to the Metal2 112 by dissolving and resolidifying the film 902 is described below. A suitable amount of acetone can be applied to the semiconductor structure 100 as a dissolving solvent. Then, a cellulose acetate film 902 is put over the semiconductor structure 100. A portion of the cellulose acetate film 902 is dissolved by the acetone over the semiconductor structure 100. The dissolved cellulose acetate flows under the Metal2 112 and/or into a space between the vias 116. Attaching/bonding can be established by evaporation of the acetone for about 20 seconds. Once attaching/bonding is established by the evaporation, the cellulose acetate film 902 is peeled off from the semiconductor structure 100, thereby removing substantially all of the Metal2 112 and the vias 116 from the semiconductor structure 100.

Although not shown, the multiple metal components such as the Metal2 112 and the vias 116 can be removed at one time by contacting the metal components with a suitable metal etchant. For example, the Metal2 112 and the vias 116 can be removed under the conditions as described above for removing the Metal2 112.

Figure 10:
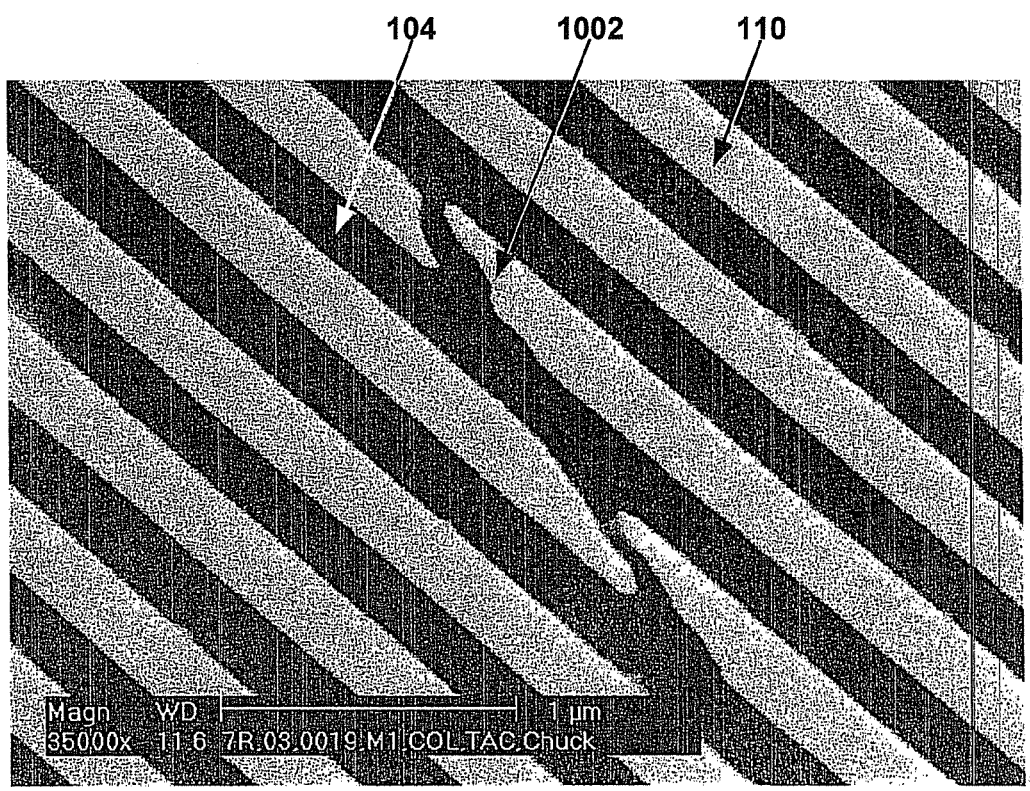
FIG. 10 shows a SEM picture of the surface of an exemplary semiconductor structure after removing metal components in accordance with one aspect of the invention.

FIG. 10 shows a SEM picture of the surface of an exemplary semiconductor structure after removing Metal2 112 and vias 116. As shown in FIG. 10, Metal1 110 and ILD1 104 are exposed, and a defect 1002 can be detected by the SEM.

Figure 11:
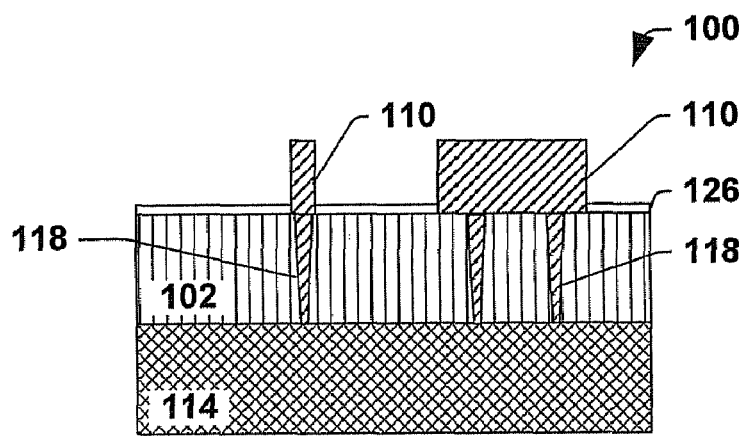
FIGS. 11-13 illustrate cross sectional views of an intermediate state of a portion of an exemplary semiconductor structure during deprocessing in accordance with one aspect of the invention.

FIG. 11 illustrates removing the etch stop layer 128 of ILD2 106 and the dielectric layer 120 of the ILD1 104 from the exemplary semiconductor structure 100. The dielectric layer 120 of the ILD 1104 can be removed by contacting the dielectric layer 120 of the ILD1 104 with any suitable etchant that does not substantially affect or damage the integrity of other layers or components in the semiconductor structure 100 such as the metal components. Removing the etch stop layer 128 of ILD2 106 and the dielectric layer 120 of the ILD1 104 reveals/exposes a portion of the semiconductor structure 100 such as the Metal 1110. The revealed/exposed portion of the semiconductor structure 100 can be inspected for defects and/or other characteristics by an inspection tool. The dielectric layer 120 can be removed without masking the semiconductor structure 100. When the dielectric layer 120 is removed without masking the semiconductor structure 100, substantially all of the dielectric layer 120 can be removed.

The etch stop layer 128 of ILD2 106 and dielectric layer of the ILD1 104 can be removed by contacting the layers with an etchant under any suitable conditions. For example, the etch stop layer 128 of ILD2 106 and dielectric layer of the ILD1 104 can be removed under the conditions as described above for removing the etch stop layer 130 of ILD3 108 and the dielectric layer 122 of ILD2 106.

Figure 12:
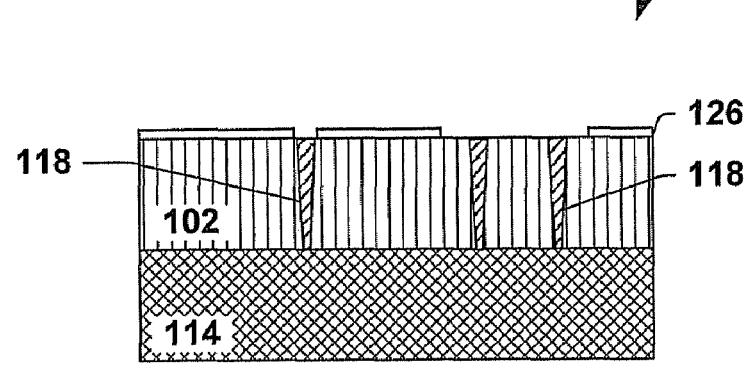

FIG. 12 illustrates removing a metal interconnect layer (e.g., Metal1 110) from the exemplary semiconductor structure 100. Removing the Metal1 110 reveals/exposes a portion of the semiconductor structure 100 such as the contacts 118. The revealed/exposed portion of the semiconductor structure 100 can be inspected for defects and/or other characteristics by an inspection tool. The Metal1 110 can be removed without masking the semiconductor structure 100. When the Metal1 110 is removed without masking the semiconductor structure 100, substantially all of the Metal1 110 can be removed.

The Metal1 110 can be removed under any suitable conditions. In one embodiment, the Metal1 110 can be removed by peeling off under the conditions as described above for removing the Metal2 112. In another embodiment, the Metal1 110 can be removed by etching under the conditions as described above for removing the Metal2 112 by etching.

Figure 13:
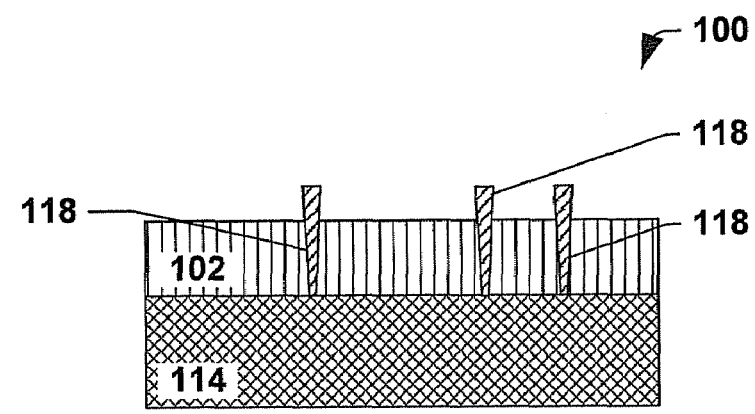

FIG. 13 illustrates removing substantially all of the etch stop layer 126 of ILD1 104 and a portion of the ILD0 102 from the exemplary semiconductor structure 100. The etch stop layer 126 of ILD1 104 and the portion of the ILD0 102 can be removed by contacting the layers with any suitable etchant that does not substantially affect or damage the integrity of other layers or components in the semiconductor structure 100 such as the contacts 118 and substrate 114. Removing the etch stop layer 126 of ILD1 104 and a portion of the ILD0 102 reveals/exposes a portion of the semiconductor structure 100 such as the contacts 118. The revealed/exposed portion of the semiconductor structure 100 can be inspected for defects and/or other characteristics by an inspection tool. The etch stop layer 126 of ILD1 104 and the portion of the ILD0 102 can be removed without masking the semiconductor structure 100. When the etch stop layer 126 of ILD1 104 is removed without masking the semiconductor structure 100, substantially all of the etch stop layer 126 of ILD1 104 can be removed.

The etch stop layer 126 of ILD1 104 and the portion of the ILD0 102 can be removed by contacting the layers with etchants under any suitable conditions. For example, the etch stop layer 126 of ILD1 104 and the portion of the ILD0 102 can be removed under the conditions as described above for removing the etch stop layer 130 of ILD3 108 and the dielectric layer 122 of ILD2 106.

Figure 14:
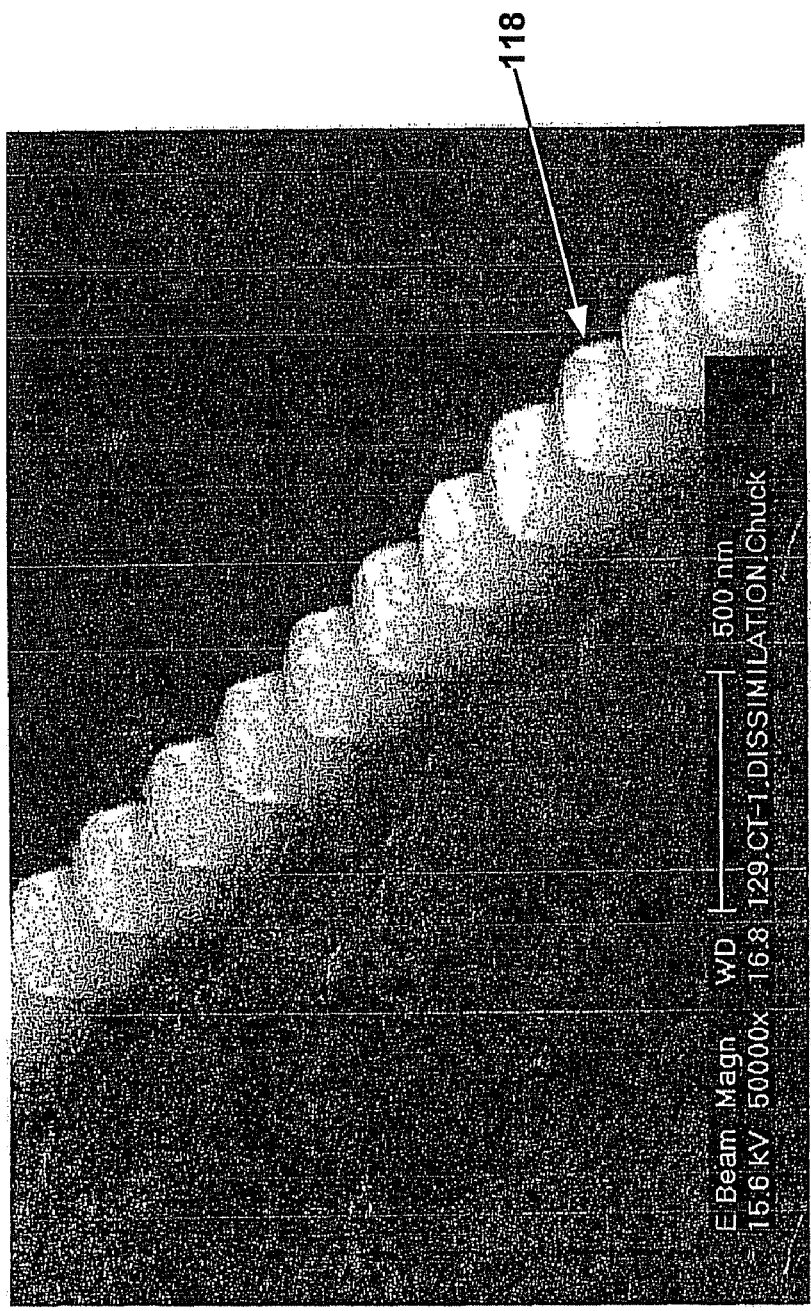
FIG. 14 shows a SEM picture of the surface of an exemplary semiconductor structure after partially removing an interlevel dielectric layer in accordance with one aspect of the invention.

FIG. 14 shows a SEM picture of the surface of an exemplary semiconductor structure after partially removing ILD0 102. As shown in FIG. 14, upper portions of contacts 118 are exposed and can be inspected by the SEM.

Figure 15:
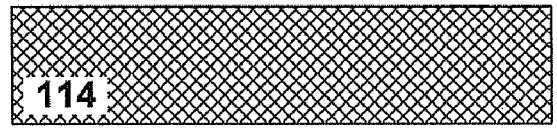
FIG. 15 illustrate a cross sectional view of a portion of an exemplary semiconductor structure during deprocessing in accordance with one aspect of the invention.

FIG. 15 illustrates removing substantially all of the ILD0 102 and contacts 118 from the exemplary semiconductor structure 100. Substantially all of the ILD0 102 can be removed by contacting the layer with an etchant under conditions described above for removing the dielectric layer 124 of ILD3 108. The contacts 118 can be removed by peeling off or etching under the conditions as described above for removing the Metal2 112.

Removing the ILD0 102 and contacts 118 reveals/exposes a portion of the semiconductor structure 100 such as the substrate 114. The revealed/exposed portion of the semiconductor structure 100 can be inspected for defects and/or other characteristics by an inspection tool. When the ILD0 102 contains features (e.g., transistors, vias, plugs, capacitors, lines, wires, gates, and interconnect (not shown)) on or within the substrate 114, those features can be inspected after removing substantially all of the ILD0 102.

Although not shown, the semiconductor structure 100 may contain other layers. For example, the semiconductor structure 100 can contain a barrier layer containing, for example, titanium and tantalum. Removing the barrier layer reveals/exposes an underlying portion of the semiconductor structure 100. The revealed/exposed portion of the semiconductor structure 100 can be inspected for defects and/or other characteristics by an inspection tool.

The barrier layer can be removed by, for example, contacting the barrier layer with an oxidizing etchant solution that does not substantially affect or damage the integrity of other layers in the semiconductor structure 100 such as the ILDs. Examples of oxidizing etchants include an acidic solution containing, for example, $H_2SO_4/H_2O_2$, $HCl/H_2O_2$, $H_2O_2/NH_4OH/H_2O$, $H_3PO_4$, $HNO_3$, or $CH_3COOH$.

As a layer/component (e.g., ILD, Metal, via, contact) of the semiconductor structure 100 is removed, the exposed layer/portion of the semiconductor structure 100 can be subjected to an inspection by using a defect inspection tool. The inspection may be conducted to inspect for defects and/or other characteristics such as circular defects (e.g., short-circuit defects and open-circuit defects), measure feature sizes, and/or determine continuity of a given layer/structure. The inspection can be conducted on at least one of the ILD0 102, LID1 104, ILD2 106, ILD3 108, Metal1 110, Metal2 112, vias 116, and contacts 118. The inspection can be conducted after removing at least one of the ILD0 102, LID1 104, ILD2 106, ILD3 108, Metal1 110, Metal2 112, vias 116, and contacts 118. For example, the Metal2 112 is inspected after removing the dielectric layer 124 of ILD3 108. In another embodiment, the Metal2 112 and the underlying vias 116 are inspected after removing the ILD3 108 and the dielectric layer 122 of ILD2 106. In yet another embodiment, the underlying vias 116 can be inspected after removing the Metal 1110. In still yet another embodiment, the contacts 118 are inspected after removing the ILD0 102.

The inspection can be conducted by any suitable defect inspection tool. Examples of the defect inspection tool include an optical microscope, a Scanning Electron Microscope (SEM), a Critical Dimension Scanning Electron Microscope (CD-SEM), a Field Effect Scanning Electron Microscope (FESEM), an In-Lens FESEM, a Semi-In-Lens FESEM, Transmission Electron Microscopy (TEM), Atomic Force Microscopy (AFM), and Scanning Probe Microscopy (SPM), depending on the desired magnification and precision.

In one embodiment, the defect inspection tool is a FESEM that permits greater levels of magnification and resolution at high or low energy levels by rastering a narrower electron beam over the sample area. A FESEM thus permits quality resolution at approximately 1.5 nm. Because a FESEM can produce high-quality images at a wide range of accelerating voltages (typically about 0.5 kV to about 30 kV), it is able to do so without inducing extensive electrical charge in a sample semiconductor structure 100. In another embodiment, the defect inspection tool is In-Lens FESEM that is capable of 0.5 nm resolution at an accelerating voltage of, for example, about 30 kV.

Figure 16:
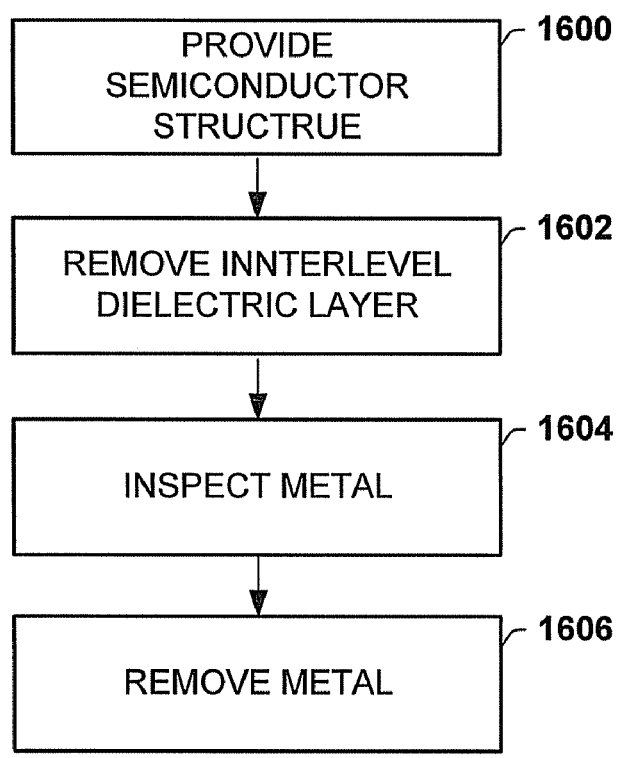
FIG. 16 illustrate a schematic block diagram of exemplary method of deprocessing a semiconductor structure in accordance with an aspect of the subject invention.

FIG. 16 illustrates an exemplary methodology according to a related aspect of the subject invention. At 1600, a semiconductor structure can be provided. The semiconductor structure can contain one or more interlevel dielectric layers and one or more metal components. At 1602, an interlevel dielectric layer can be removed by using a suitable etchant. When the interlevel dielectric layer contains a dielectric layer and an etch stop layer, the dielectric layer and the etch stop layer can be removed at the same time under a suitable condition. A desired amount of interlevel dielectric layers (e.g., single interlevel dielectric layer or multiple interlevel dielectric layers) can be removed with etching by selecting suitable etching conditions. By removing the interlevel dielectric layer, the underlying metal components such as a metal layer and vias can be revealed/exposed.

At 1604, the revealed/exposed metal component can be subjected to inspection for defects and/or other characteristics by an inspection tool. At 1606, the metal component can be removed. The metal component can be removed by peeling off by using a film that can attach or bond to the metal component or by etching the metal component by using, for example, an acidic solution. For example, multiple components such as a metal layer and underlying vias can be removed by peeling off at one time. In another embodiment, an exposed single metal component (e.g., metal layer) can be removed by etching. After removing the metal component, the semiconductor structure can be subjected to an inspection for defects and/or other characteristics.

Although not shown, when a semiconductor structure contains multiple interlevel dielectric layers and multiple metal layers, acts 1602 through 1606 can be repeated as many times as desired.

The semiconductor structure which can be subjected to the method is any suitable structure that can be employed for central processing units (CPUs); volatile memory devices such as DRAM devices, SRAM devices, and the like; input/ output devices (I/O chips); and non-volatile memory devices such as EEPROMs, EPROMs, PROMs, and the like. The semiconductor structure can be employed for substantially any electronic device such as a memory.

For example, the semiconductor structure is useful in computers, appliances, industrial equipment, hand-held devices, telecommunications equipment, medical equipment, research and development equipment, transportation vehicles, radar/satellite devices, and the like. Hand-held devices, and particularly hand-held electronic devices, achieve improvements in portability due to the small size and lightweight of the memory devices. Examples of hand-held devices include cell phones and other two way communication devices, personal data assistants, Palm Pilots, pagers, notebook computers, remote controls, recorders (video and audio), radios, small televisions and web viewers, cameras, and the like. Since the semiconductor structure can be employed for substantially any electronic device, the method of deprocessing the semiconductor structure is useful for inspecting defects and/or other characteristics in these electronic devices.

What has been described above includes examples of the subject invention. It is, of course, not possible to describe every conceivable combination of components or methodologies for purposes of describing the subject invention, but one of ordinary skill in the art may recognize that many further combinations and permutations of the subject invention are possible. Accordingly, the subject invention is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A method of deprocessing a semiconductor structure comprising one or more metal components separated from each other by one or more interlevel dielectric layers on a substrate, comprising:
   removing a portion of or substantially all of the interlevel dielectric layer by contacting the semiconductor structure with an etchant without substantially affecting or damaging an integrity of the metal components;
   removing substantially all of the metal component by contacting the semiconductor structure with an etchant without substantially affecting or damaging an integrity of the interlevel dielectric layer; and
   inspecting the semiconductor structure.

2. The method of claim 1, wherein the portion of or substantially all of the interlevel dielectric layer is removed by contacting the semiconductor structure with an isotropic etchant.

3. The method of claim 1, wherein the portion of or substantially all of the interlevel dielectric layer is removed by contacting the semiconductor structure with buffered hydrofluoric acid.

4. The method of claim 1, wherein substantially all of the two or more interlevel dielectric layers are removed at one time by contacting the semiconductor structure with the etchant.

5. The method of claim 1, wherein the metal component comprises interconnect metal layers, vias, contacts, plugs, lines, wires, and paths.

6. The method of claim 1, substantially all of the metal component is removed by contacting the semiconductor structure with a $H_2SO_4/H_2O_2$ solution.

7. The method of claim 1, wherein the semiconductor structure comprises two or more metal components separated from each other by two or more interlevel dielectric layers on the substrate; removing the portion of or substantially all of the interlevel dielectric layer is conducted two or more times; and removing substantially all of the metal component is conducted two or more times.

8. A method of deprocessing a non-volatile memory device, comprising:
   removing a portion of or substantially all of an interlevel dielectric layer by contacting the non-volatile memory device with an etchant without substantially affecting or damaging an integrity of a metal component of the non-volatile memory device,
   removing substantially all of the metal component by contacting the semiconductor structure with a metal etchant without substantially affecting or damaging an integrity of the interlevel dielectric layer of the non-volatile memory device.

9. The method of claim 8, wherein the interlevel dielectric layer and the metal component are removed without masking the non-volatile memory device.

10. The method of claim 8, wherein the portion of or substantially all of the interlevel dielectric layer is removed by contacting the semiconductor structure with an isotropic etchant.

11. The method of claim 8, wherein the portion of or substantially all of the interlevel dielectric layer is removed by contacting the semiconductor structure with buffered hydrofluoric acid.

12. The method of claim 8, wherein substantially all of the two or more interlevel dielectric layers are removed at one time by contacting the semiconductor structure with the etchant.

13. The method of claim 8, wherein the metal component comprises interconnect metal layers, vias, contacts, plugs, lines, wires, and paths.

14. The method of claim 8, substantially all of the metal component is removed by contacting the semiconductor structure with a $H_2SO_4/H_2O_2$ solution.

15. A method of inspecting a semiconductor structure for defects and/or other characteristics, comprising:
   revealing a metal component by removing a portion of or substantially all of an interlevel dielectric layer without using a mask; and
   revealing an interlevel dielectric layer by removing substantially all of the metal component by contacting the semiconductor structure with a metal etchant without using a mask.

16. The method of claim 15, wherein inspecting the semiconductor structure is conducted using a microscope.

17. The method of claim 15, wherein the portion of or substantially all of the interlevel dielectric layer is removed by contacting the semiconductor structure with an isotropic etchant.

18. The method of claim 15, wherein the portion of or substantially all of the interlevel dielectric layer is removed by contacting the semiconductor structure with buffered hydrofluoric acid.

19. The method of claim 15, wherein substantially all of the two or more interlevel dielectric layers are removed at one time by contacting the semiconductor structure with the etchant.

20. The method of claim 15, substantially all of the metal component is removed by contacting the semiconductor structure with a $H_2SO_4/H_2O_2$ solution.

* * * * *